United States Patent [19]

Rosen

[11] Patent Number: 4,675,628

[45] Date of Patent: Jun. 23, 1987

[54] DISTRIBUTED PIN DIODE PHASE SHIFTER

[75] Inventor: Arye Rosen, Cherry Hill, N.J.

[73] Assignee: RCA Corporation, Princeton, N.J.

[21] Appl. No.: 706,752

[22] Filed: Feb. 28, 1985

[51] Int. Cl.[4] ........................ H03H 11/20; H01P 9/00

[52] U.S. Cl. ........................................ 333/164; 357/58

[58] Field of Search ........................ 333/164, 161, 156; 357/58; 307/317 R

[56] References Cited

U.S. PATENT DOCUMENTS

| | | | |
|---|---|---|---|
| 3,158,760 | 11/1964 | Taylor | 357/58 X |
| 3,192,398 | 6/1965 | Benedict | 357/58 X |
| 3,454,945 | 7/1969 | Hyltin | 357/58 X |
| 3,493,821 | 2/1970 | Bittman et al. | 357/58 X |
| 3,551,707 | 12/1970 | Seitzer | 307/317 |
| 3,560,891 | 2/1971 | MacLeay et al. | 333/164 |
| 3,721,923 | 3/1973 | Gray et al. | 333/164 |
| 3,750,055 | 7/1973 | Funck | 333/161 |
| 3,911,382 | 10/1975 | Harth et al. | 333/161 X |
| 4,059,814 | 11/1977 | Folberth | 333/156 |
| 4,275,367 | 6/1981 | Gaglione et al. | 333/164 |
| 4,382,261 | 5/1983 | Freibergs et al. | 343/701 X |
| 4,450,419 | 5/1984 | Schwarzmann | 333/164 |
| 4,490,721 | 12/1984 | Stockton et al. | 333/164 X |

OTHER PUBLICATIONS

Article "Microwave Semiconductor Devices and Their Circuit Applications" by H. M. Olson, 1969, pp. 271–272.

Title: Low-Loss Millimeter Digital Phase Shifters Suitable for Monolithic Implemention, Author: B. S. Yarman, A. Rosen, W. R. Curtice & P. Stabile, Printed: Reprinted from IEEE 1984 International Symposium on Circuits and Systems Proceedings, May 1984.

Title: Millimeter-Wave GaAS Distributed Impatt Diodes, Author: B. Bayraktaroglu & H. D. Shih, Printed: IEEE Electron Dice Letters, vol. EDL-4, No. 11, Nov. 1983.

Title: Silicon Millimetre-Wave Integrated-Circuit (SIMMWIC) SPST Switch, Author: P. J. Stabile & A. Rosen, Printed; Electronics Letters, 10-25-85, vol. 20, No. 22.

Title: High-Power Low-Loss Pin Diodes For Phased-Array Radar, Author: Rose, Martinelli, Schwarzman, Brucker, & Swartz, Printed: Mar. 1979, vol. 40, No. 1.

*Primary Examiner*—Eugene R. LaRoche
*Assistant Examiner*—Benny Lee
*Attorney, Agent, or Firm*—Joseph S. Tripoli; William H. Meise; Henry I. Steckler

[57] ABSTRACT

A monolithic chip phase shifter consists of a PIN diode which is laterally elongated and shaped into a microstrip-like transmission line. The transmission line has characteristics determined in part by the capacitances associated with the intrinsic layer of the diode. Alternating-current (AC) signals are coupled through the transmission line. Direct-voltage reverse bias, no bias or direct-current forward bias are applied to select the appropriate value of equivalent shunt capacitance of the transmission line to provide the desired phase shift of the AC signals passing therethrough. A high-impedance coupling device couples the bias to the transmission line to prevent leakage of signal to the bias source.

18 Claims, 18 Drawing Figures

DISTRIBUTED PIN DIODE PHASE SHIFTER

This invention relates to a loaded-transmission-line type of shifter implemented as a distributed PIN diode.

Many modern radar systems, and other high-frequency communications systems, use scanning array antennas rather than bulky, expensive and slow-scanning mechanical reflectors. The scanning array antenna system consists of a number of closely-spaced small antennas driven from (or driving, these being reciprocal) a common source. Steering of the resulting beam from the antenna array is accomplished by controlling the phase of the signals applied to each element of the array relative to the other elements. If only on-axis radiation is required, then phase shifters are ordinarily not required. However, if the beam is to be scanned or moved in space relative to the boresight axis of the array, then variable or controllable phase shifters must be provided. Simple controllable phase shifters can be accomplished by the use of different lengths of transmission line which are switched into or out of the transmission path to add a delay corresponding to the propagation delay of the length of transmission line so switched. Such systems are somewhat difficult to implement, because the simplest electronically-controlled type requires switching diodes series-connected with the transmission line. The biasing of such series-connected diodes requires series-connected capacitors to prevent the controlling bias signal applied to one diode from affecting the diode associated with the next transmission-line section. The series diodes and coupling capacitors are costly and introduce losses. In addition to the series-diode types, other switching phase shifters are known which switch lengths of shunt transmission line into circuit with the main transmission line path, as described for example in U.S. Pat. No. 4,275,367, issued June 23, 1981 to Gaglione et al. A major disadvantage of the switched-transmission-line type of phase shifter is the finite number of values of phase shift which ca be achieved. Without infinitely variable control, scanning of the beam of an antenna cannot be accomplished in a smooth and continuous manner.

It is also known to use transmission lines loaded with ferrite or other magnetic material, the magnetic properties of which are changed by control windings in order to change the effective series inductance of the transmission line and thereby change the phase shift. Such ferrite phase-shifters are reliable and capable of handling high power, but are bulky, and may be slow to slew, due to the inductance of the control winding which retards the rise time of a control signal. Also a large amount of assembly is required for ferrite phase shifters and they are therefore expensive and they may therefore also be variable from unit to unit.

It is known that the phase shift of two-conductor transmission-lines such as twin-lead, coax and microstrip (normally operated in the TEM mode) can be controlled. It is known to couple diodes across the conductors of a transmission line at points periodically spaced along the transmission line and to bias the diodes into a capacitive mode, wherein the amount of capacitance selected by the bias establishes the delay of the transmission line and therefore establishes the phase shift. Such structures may suffer from impedance mismatch resulting from the periodicity of the discontinuities in impedance caused by the regular placement of the diodes along the transmission line. That is, the reflections from each mismatched diode add to the reflections from the previous diode and can result in large mismatches at frequencies at which the spacing is near a half-wavelength. Also, the power-handling capacity may be limited by the power-handling capability of the diode which is located closest to the signal source, because the remainder of the diodes are subject to less power than the first diode due to the attenuation of the transmission line. Furthermore, such arrangements suffer from the same high cost and unit-to-unit inconsistency as the ferrite phase shifters because of the assembly, which is required, may result in unit-to-unit variations in the locations of the diodes. Such unit-to-unit variations are most disadvantageous, especially for large antenna arrays having a large number of elements, because the phase shifters, when installed, have a random distribution of phase shifts rather than a uniform phase shift, thereby requiring an initial alignment merely to remove the unit-to-unit variations.

It is also known from the paper "Low-Loss Millimeter-Wave Digital Phase Shifters Suitable for Monolithic Implementation," by Yarman et al., published in the IEEE 1984 International Symposium on Circuits and Systems Proceedings, May 1984, to couple PIN diodes periodically along the transmission line and to operate them in a reverse-biased mode in which they present a capacitance to the transmission line, and also to operate the PIN diode in a short-circuit mode when the diode is forward-biased.

It is known from U.S. Pat. No. 3,911,382 issued Oct. 7, 1975, to Harth et al. to make a tunable delay line having a metal-insulator-semiconductor (MIS) structure. The patent does not make clear which elements of the structure are biased, but the bias creates a space charge in the semiconductor. The described structure is definitely not a diode, however, and such a structure may have substantially higher loss than a diode structure, and may therefore not be acceptable for high-power applications.

It would be desirable to have a phase shifter which is small, which is fabricated by batch processing for unit-to-unit consistency and low cost, which is capable of operating with low loss, and with high power, and is controllable in an infinitely-variable manner.

SUMMARY OF THE INVENTION

A PIN diode distributed phase shifter according to the invention includes a substantially flat monolithic chip including vertical layers defining a PIN junction. The PIN junction is laterally elongated to define first and second ends of the junction. Alternating current is coupled to the first end of the PIN junction for propagation through the junction to the other end. The signal is coupled from the second end of the junction. A bias arrangement is coupled to the PIN junction for changing the electrical characteristics of the junction for controlling the relative phase shift of the signal.

DESCRIPTION OF THE INVENTION

Figure 1:
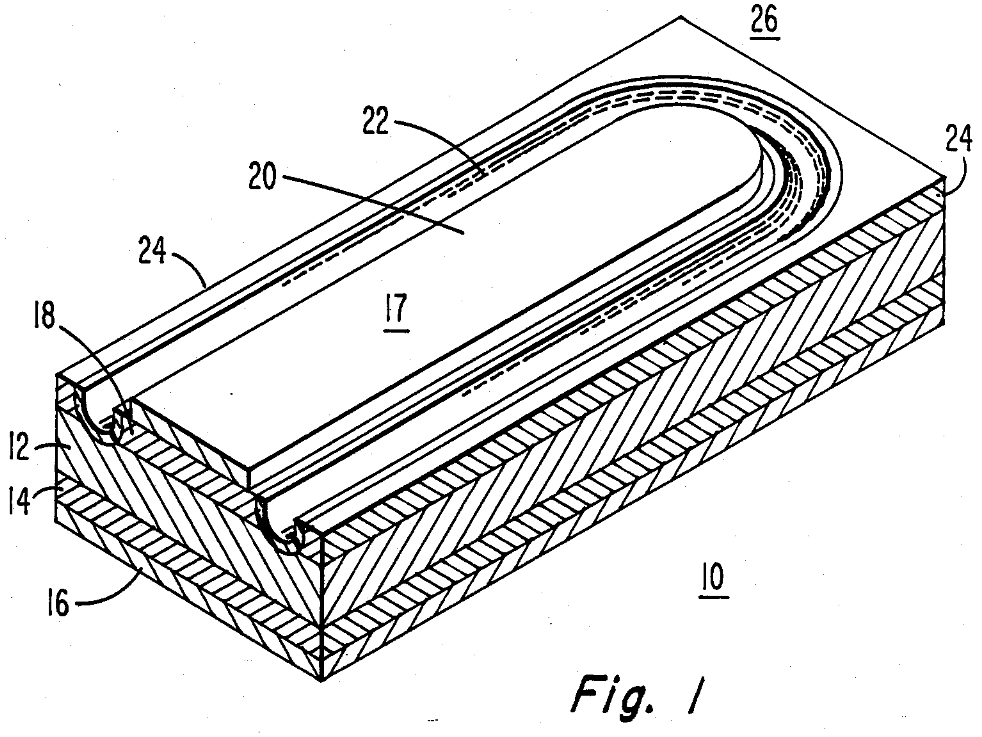
FIG. 1 is a perspective view of a section of a distributed PIN diode.
Figure 2:
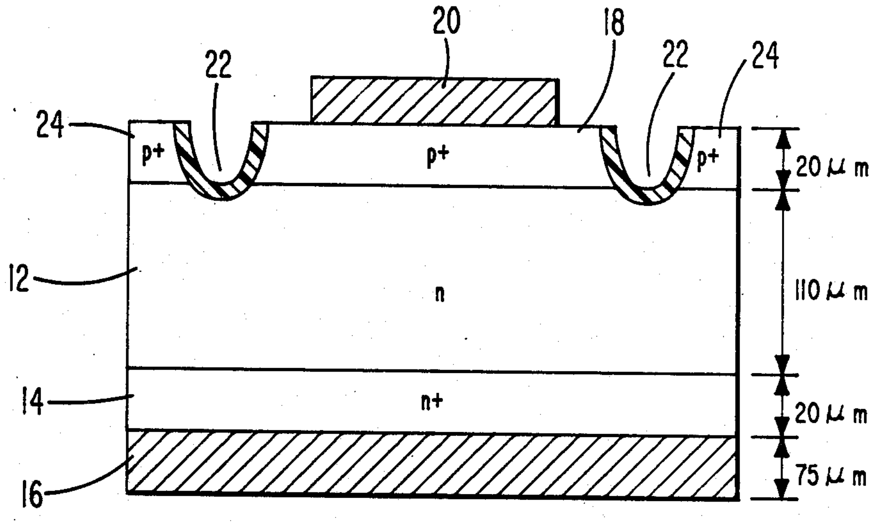
FIG. 2 is an end view of the section of FIG. 1.

FIG. 1 is a sectioned view of a monolithic chip designated generally as 10 and FIG. 2 is an end view thereof. Chip 10 is a generally flat monolithic chip which is basically a single semiconductor material such as silicon with layers of various dopings. A layer 12 is substantially undoped or substantially intrinsic and therefore has a relatively high resistance. It may have a slight n doping. Layer 12 overlies a region 14 heavily doped with Phosphorus atoms (n+). A layer of metal 16 is bonded to the side of the n+ layer opposite intrinsic layer 12. An elongated strip designated generally as 17 includes an elongated strip 18 of semiconductor material doped with excess Boron to create a p+ layer which overlies intrinsic region 12. Strip 17 also includes a metallization layer 20 which overlies elongated strip 18 and conforms to its shape. As so far described, monolithic chip 10 has a vertical doping profile corresponding to that of a PIN junction.

A moat 22 separates p+ region 18 from the u-shaped remainder of the surrounding p+ regions 24. An insulating or passivation material coats the surface of moat 22 and may extend somewhat beyond the moat. Moat 22 is continuous near end region 26 of elongated strip 17, and isolates strip 17 from electrical contact other than to intrinsic layer 12.

Figure 3:
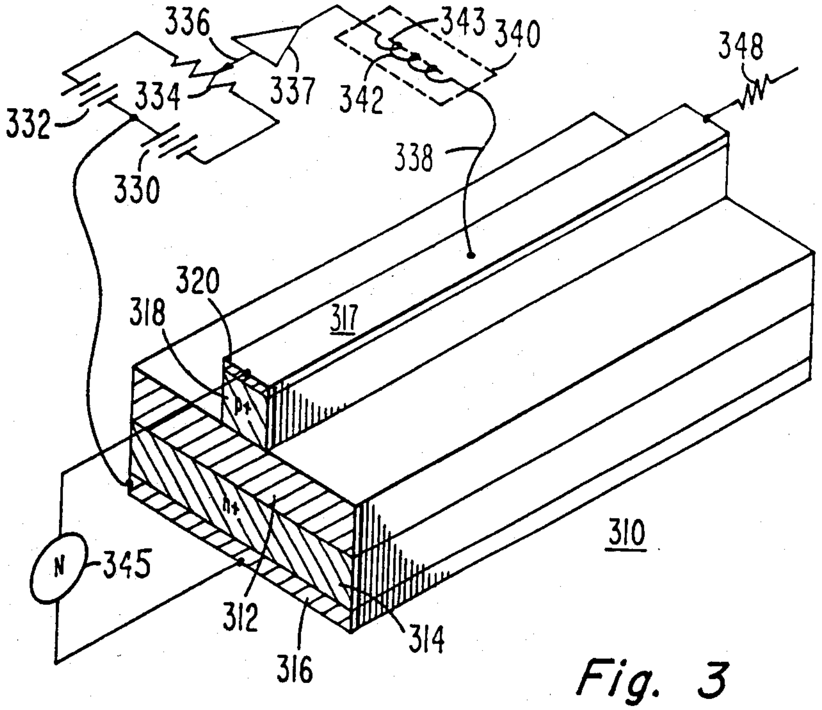
FIGS. 3 and 4 illustrated in simplified form distributed PIN diodes with biasing and signal coupling to form phase shifters in accordance with an aspect of the invention.

The junction can be biased by applying a direct voltage or a direct current, as appropriate, to metallization 20 relative to bottom metallization 16. Referring now to FIG. 3, elements corresponding to elements of FIGS. 1 and 2 are designated by the same reference numbers in the 300 series. As illustrated in FIG. 3, a bias source consisting of a pair of batteries 330,332 is connected in series and their junction is connected to metallization 316. Because bottom metallization 316 will ordinarily be at ground potential when monolithic chip 310 is used as a phase shifter, metallization 316 is hereinafter referred to as "ground" metallization. A potentiometer 334 is connected across the batteries and its tap 336 couples a selected voltage, either positive or negative with respect to ground, to strip metallization 320 by way of a buffer amplifier 337 and a wire 338. As illustrated in FIG. 3, foward bias is accomplished by making strip 317 positive with respect to ground metallization, and reverse bias by making it relatively negative.

When monolithic chip 310 is connected as a phase shifter by coupling a source 345 of alternating current (AC) across metallizations 316 and 320 for transmission of AC signal energy to a load or other utilization means illustrated as a resistor 348, the signal on elongated strip 317 will include an alternating component. In order to prevent the alternating component from being coupled to the bias source, a high impedance element illustrated as a dotted block 340 is coupled in series with wire 338. As illustrated within block 340, the high impedance element may be a solenoidal inductor 342. A magnetic core such as a ferrite core may be associated with inductor 342, as symbolized by broken-line core 343.

The AC signal energy applied to phase shifter 310 is guided by a transmission-line structure similar to a microstrip transmission line, in which ground metallization 316 and n+ region 314 correspond to the ground plane of a microstrip line, strip 317 (including p+ region 318 and strip metallization 320) corresponds to the strip conductor of the microstrip line, and a region surrounding intrinsic layer 312 corresponds to the dielectric layer of the microstrip line. This constitutes a "through" transmission line which passes laterally through the monolith.

The through transmission line within monolithic chip 310 by which AC energy flows from source or generator 345 to load 348 is believed to operate in a TEM mode, with an effective series inductance principally associated with strip 317, and with the principal component of the electric field extending between strip 317 and the conductive bottom region consisting of n+ region 314 and ground metallization 316. The magnitude of the bias affects the capacitance between strip 317 and the conductive bottom region, and thereby determines the delay of the AC signal traversing the through transmission line, and therefore establishes the relative phase shift, as described in more detail below.

Figure 4:
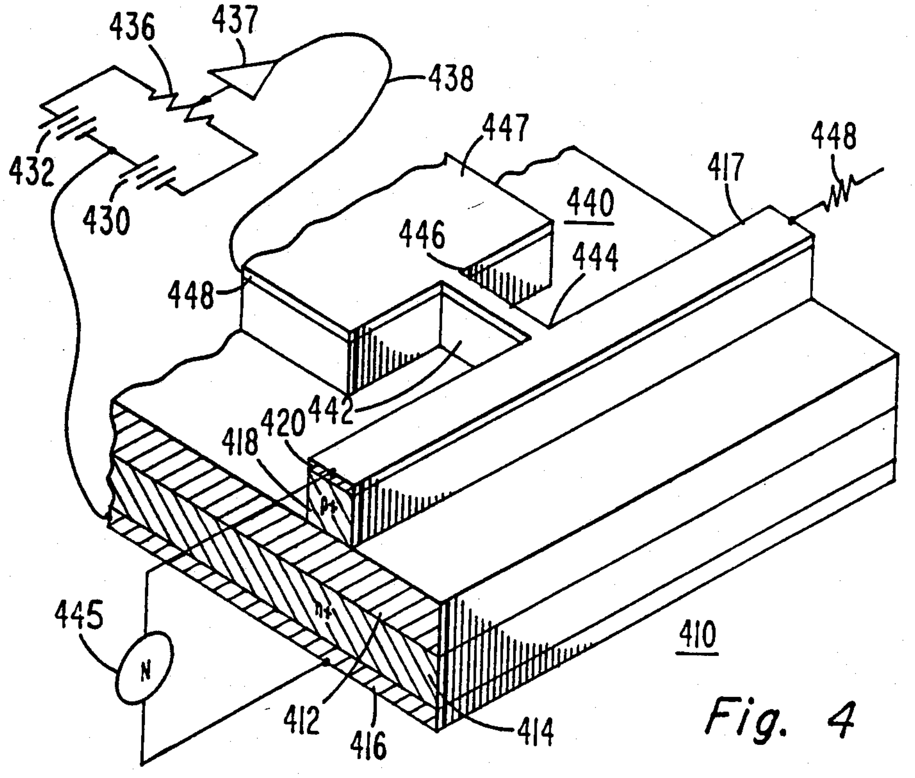

FIG. 4 illustrates a structure generally similar to that of FIG. 3, but in which the high impedance element is formed as part of the monolith. Elements in FIG. 4 corresponding to elements in FIG. 3 are designated by the same reference number in the 400 series rather then in the 300 series. In the arrangement of FIG. 4, monolithic chip 410 includes, as part of its structure, an elongated strip 442 of p+ material overlaid by metal which extends from a point 444 at which strip 442 intersects strip 417, at substantially right angles thereto to a point 446, where it intersects a relatively wide strip conductor 447 including a p+ layer (not separately designated) and metallization 448. Wire 438 from the bias source is coupled to metallization 448. The width of the strip 442 is much narrower than the width of strip 417, thereby forming a high impedance transmission line coupled to elongated strip conductor 417. The narrow width of strip 442 tends to reduce the amount of AC power flowing onto strip 442 from the through AC transmission path extending from AC source 445 to load 448. In order to further reduce the amount of alternating signal leaving the through transmission path by way of the bias source, the length of strip 442 may be made equal to one quarter-wave at the AC frequency of operation, as known. Wide strip conductor 447 has a relatively low impedance, and together with narrow strip 242 forms a low-pass filter.

Figure 5:
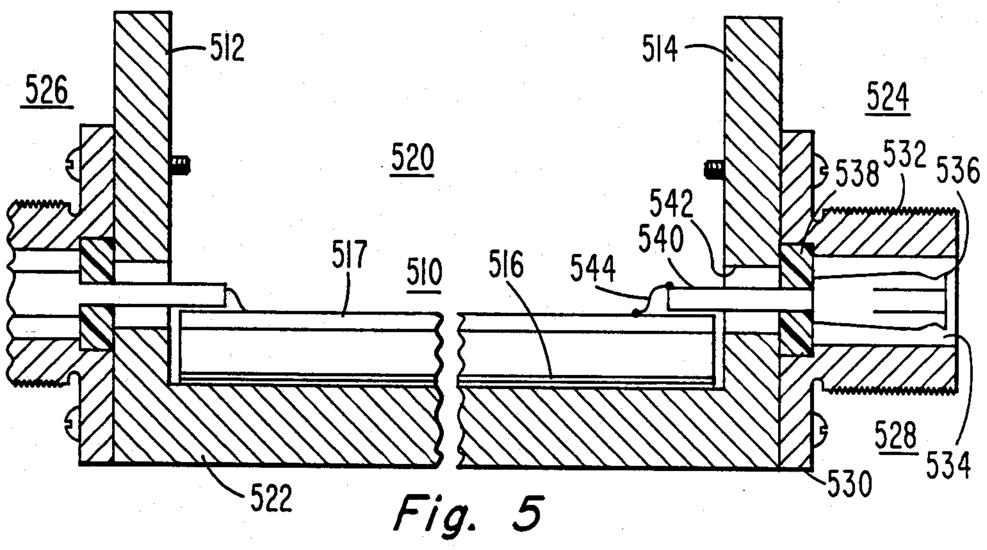
FIG. 5 illustrates an arrangement for coupling alternating signals to and from a structure such as that illustrated in FIG. 1.

FIG. 5 is a cross-sectional view of a portion of a mounting arrangement for a monolithic chip such as the chip of FIG. 1 when used as a phase shifter. In FIG. 5, 510 designates the monolithic chip generally, 517 represents the elongated strip of p+ and its overlying metallization, and 516 represents the ground metallization. Monolithic chip 510 fits between upright sides 512 and 514 of a U-shaped channel designated generally as 520 having a bottom section 522 joining upright sides 512 and 514. Chip 510 is pressed against the top surface of bottom section 522 by spring clips (not shown). The large surface area and close spacing between bottom section 522 and metallization 516 provides a low impedance path for the flow of current. A conductive epoxy may be used to further reduce the resistance. Alternating current energy is coupled to and from the through transmission line formed by the various portions of chip 510 by coax-to-microstrip adapters 524 and 526 at the right and left extremes of the figure. Since these adapters are identical, only adapter 524 will be described in detail. Coax-to-microstrip type adapter 524 includes a coax-to-pin adapter designated generally at 528 which consists of a flange 530 formed integrally with a threaded body 532 having a bore 534. Bore 534 contains a coaxial center-conductor connector illustrated as 536 which is supported by a dielectric washer illustrated as 538. Connector 536 is integral with a conductive pin 540 which protrudes past flange 530. Transition 524 includes not only connector 528 but an aperture 542 formed in wall 514 through which conductive pin 340 projects. Aperture 542 is located relative to bottom 522 at a height which locates pin 540 immediately adjacent to the end of strip 317. Connection between pin 540 and the upper metallization of strip 317 is accomplished by means of a bond wire 544 connected at its ends by soldering, welding, or the like. Such connections are well-known in the art and require no further explanation.

Figure 6A:
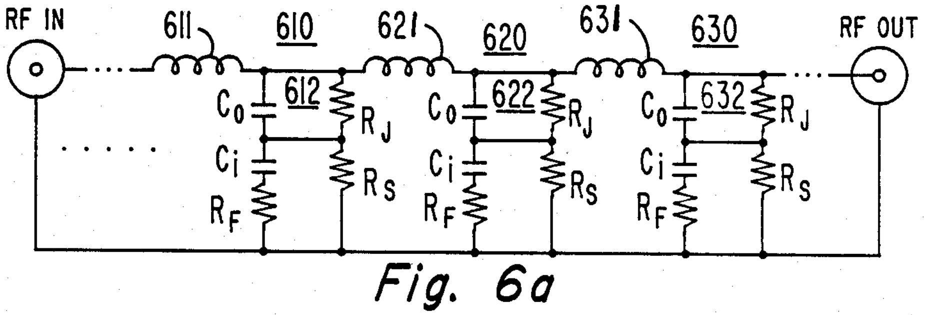
FIG. 6a is a simplified equivalent circuit of an arrangement according to the invention with the PIN junction substantially unbiased.

FIG. 6a is an equivalent circuit of the through transmission line of a substantially unbiased distributed PIN diode phase shifter in the form of a cascade of identical lattice sections 610, 620, 630 . . . each of which includes a series inductor 611, 621, 631 . . . . Associated with each lattice section is a shunt circuit 612, 622, 632 . . . consisting of a pair of series-connected capacitors $C_0$ and $C_i$ and a pair of series-connected resistors $R_J$ and $R_s$, and an interconnection between the junctions of the resistors and the capacitors. A resistance $R_F$ is in series with capacitor $C_i$. Capacitor $C_0$ represents the capacitance of the carrier depleted portion (depletion region) of the I layer, and $C_i$ represents the capacitance of the undepleted portion of the I layer. Resistor $R_s$ represents the resistance of the undepleted portion of the I layer, and $R_J$ represents the resistance of the depleted portion of the I layer. The magnitudes of the capacitances and resistances are controlled by the bias voltage. Thus, not only do the magnitudes of the capacitances change, but the effective form of the lattice may also change as resistances $R_s$ or $R_J$ change.

Figure 6B:
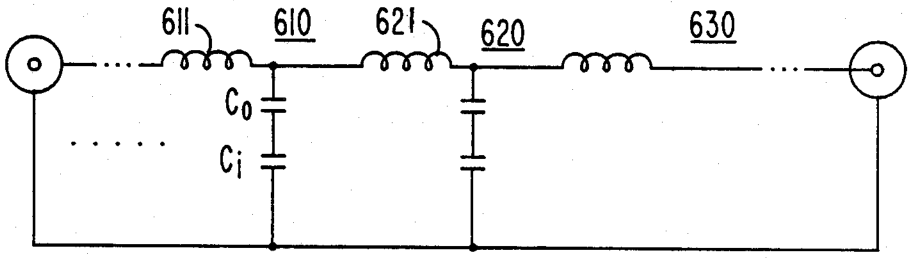
FIG. 6b represents a more reverse-biased condition.

FIG. 6b represents the equivalent circuit when the PIN junction is more reverse-biased than the condition illustrated in FIG. 6a. Under such conditions, resistances $R_J$ and $R_s$ become large, therefore vanishing. When the value of a resistor becomes large and approaches infinity (or if it simply becomes large by comparison with other impedances in a circuit) its effect on the circuit becomes inconsequential, and the circuit operates as through the resistor were not there at all, ie. as though it "vanishes". As mentioned, the magnitude of depletion-region capacitance $C_0$ can be varied by control of the magnitude of the reverse-bias, a decrease in capacitance accompanying an increase in reverse voltage.

Figure 6C:
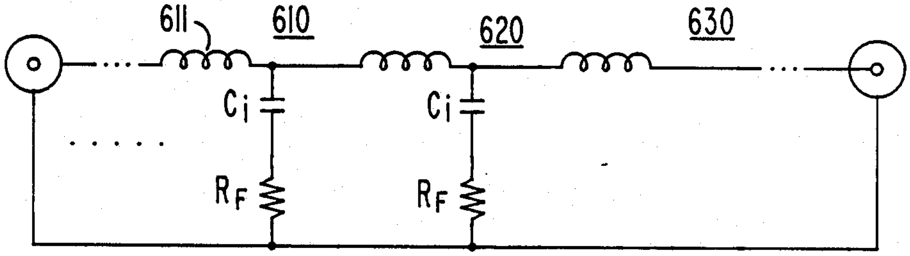
FIG. 6c represents a more forward-biased condition.
Figure 7:
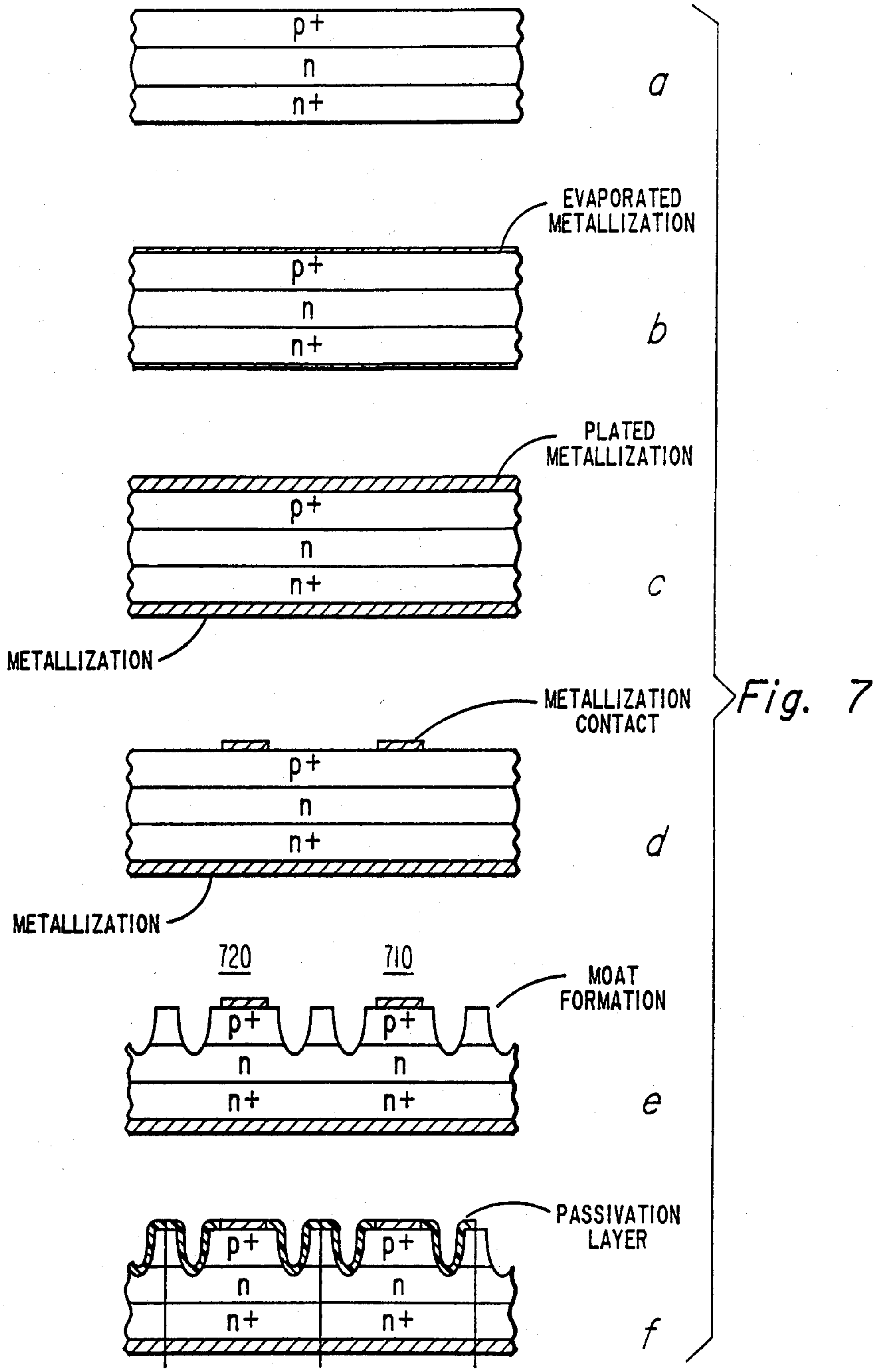
FIG. 7 illustrates the processing steps for fabricating the monolithic portion of the structure illustrated in FIGS. 1 and 2.

FIG. 6c illustrates the equivalent circuit for forward-bias relative to the condition of FIG. 6a. In FIG. 6c, resistance $R_F$ dominates. Capacitance $C_i$ is small, and no longer represents the depletion capacitance but instead represents the parallel-plate capacitance between the metallization layers of the diode.

Thus, the capacitance may ideally be varied from a small value of $C_i$ at large reverse bias, to a large value of $C_i$ at lesser values of reverse bias, then switching over to small values of $C_0$ at forward bias. The phase shifts associated with these bias conditions depend principally upon the relative magnitudes of $C_0$ and $C_i$, which in turn depends upon the construction and doping of the PIN junction. In the transition region between full forward and full reverse bias the resistances may be finite and their effect on phase shift must be considered.

FIGS. *7a–7f* illustrate steps in the processing of the monolithic chip. In FIG. *7a*, a section of a thinned silicon wafer can be seen which is doped from the upper side with p+ and from the bottom side with n+. The intrinsic silicon has a light n doping. A thin metal coating is evaporated onto each side (FIG. *7b*) and the thickness of the metal is built up by electroplating (FIG. *7c*). Photolithography is used to deposit a photoresist (not shown), to define a plurality of elongated areas, and the remainder of the upper metallization is then etched away to define a plurality of elongated upper metallization strips (seen in end view in FIG. *7d*). A plurality of individual transmission lines 710, 720 . . . are defined by etching of a plurality of moats around the elongated strips, as illustrated in FIG. *7e*. Finally, a passivation layer of $S_iO_2$ is applied over the moats and the nearby regions. The structure, having a plurality of phase shifters on one wafer, may be cut apart for individual use, or the phase shifters may be used at the same time for performing phase shifting for a number of different loads, such as for the individual elements of a phased array antenna.

The described phase shifter is manufactured by a batch process, and therefore is highly repeatable from unit to unit, which is highly advantageous for applications in phased array antennas and other phasing matrices. By comparison with a structure consisting of discrete PIN diodes, the power handling capability its higher because the power is dissipated throughout the entirety of the structure, resulting in lower temperatures for a given condition of operation. The power handling capability is further enhanced by the thin distributed structural arrangement which allows heat to pass through the entire bottom surface of the monolithic chip to the heat-sinking mounting 322. By comparison with MIS structures, the power-handling capability is higher and the performance of the active portion under various environmental conditions is well known. In particular, the performance of PIN diodes under condition of a high neutron flux is well known.

Figure 8:
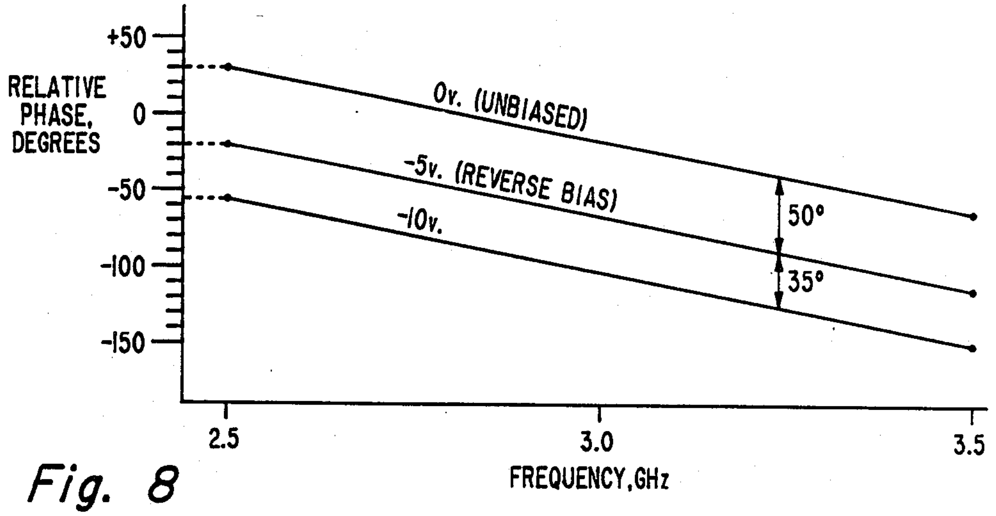
FIG. 8 is a series of phase-vs-frequency plots of a PIN phase shifter according to the invention, with bias voltage as a parameter.

FIG. 8 illustrates phase shift vs. frequency with voltage as a parameter for an experimental monolithic phase-shifter batch-processed as described above and having the following physical characteristics:

| | | |
|---|---|---|
| Wafer Diameter | 4" | |
| 5 transmission lines, length each | 1.130" | 28.70 mm |
| width each (between moat edges) | 0.030" | 0.762 mm |
| upper (p+) region thickness | — | 20 μm |
| intrinsic (n) region thickness | — | 110 μm |
| lower (n+) region thickness | — | 20 μm |

-continued

Figure 9:
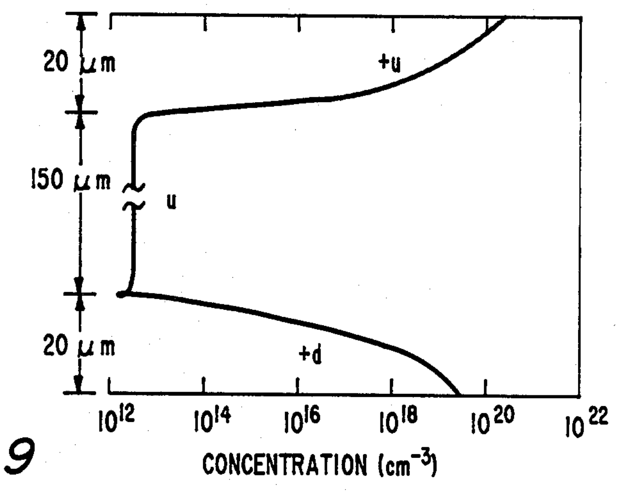
FIG. 9 illustrates the doping profile of the PIN junction of the phase shifter from which the data plotted in FIG. 8 was taken.

| | |
|---|---|
| ground metallization thickness | 75 μm |

and having a spreading-resistance profile defined by the doping concentration in the PIN diode region illustrated by the plot of FIG. 9.

In FIG. 8, relative phase is plotted over a frequency of 2.5 to 3.5 GHz. The phase difference between the zero-bias condition and the −5 volt reverse bias condition is constant at about 50° over the frequency range. Increasing the reverse-bias to −10 volts increases the phase by 35°, for a total change of 85° relative to the zero-bias condition. It should be noted that if the bias change simply caused a change in the delay of the transmission line, the phase change would be about 40% greater at 3.5 GHz compared with 2.5 GHz, because of the difference in wavelength. Phase change also occurred at frequencies well above 3.5 GHz (not illustrated), but was not as well behaved as the phase change in the interval 2.5–3.5 GHz. It is believed that the anomalous behavior above 3.5 GHz was due to inadvertent reactances attributable to the launchers, and not due to any inherent limitation of the phase shifter itself.

Figure 10:
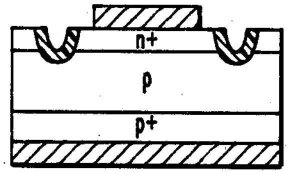
FIG. 10 illustrates an alternate vertical doping arrangement for a PIN diode.

FIG. 10 illustrates another PIN diode doping arrangement whih can be used for a distributed phase shifter inaccordance with the invention. FIG. 10 is a cross-section of a diode including an n+ region and a p+ region with a substantially intrinsic layer (p) therebetween, forming PIN junction. A layer of metallization covers the side of the p+ region remote from the intrinsic layer. A moat defines a portion of the n+ region, which is overlain by another metallization.

Figure 11:
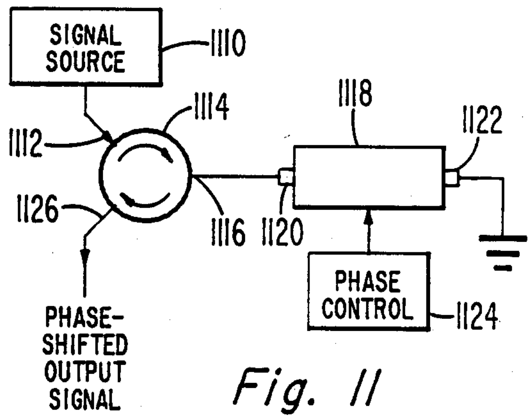
FIG. 11 is a simplified block diagram of a phase shifter according to the invention connected for increasing the range of the phase shift.

In FIG. 11, a phase shifter according to the invention is connected in a reflection mode for doubling the effective phase shift by comparison with the through mode of operation. In FIG. 11, a source 1110 applies AC signal to an input port 1112 of a circulator 1114, which couples the signal with low loss to a port 1116. The AC signal leaves port 1116 and enters a distributed PIN diode phase shifter 1118 at a port 1120. The signal traverses the through transmission line of phase shifter 118 to an output port 1122. As illustrated, port 1122 is terminated in a short circuit. The AC signal is therefore reflected at the short-circuit, and once again traverses the through transmission line to port 1120, accumulating additional phase shift. The magnitude of the phase shift occasioned during each of the traversals is controlled by a phase control block 1124. The twice-phase-shifted signal enters circulator 1114 at port 1116 and is coupled with low loss to output port 1126.

Other embodiments of the invention will be apparent to those skilled in the art. For example, semiconductor materials other than silicon may be used, and the doping may be accomplished by any suitable doping atoms. The signal generator, utilization load or both may be formed on the same monolithic chip as the phase shifter. Other types of launchers may be used to couple AC energy to and from the through transmission line of the phase shifter. In order to reduce the overall physical length of the phase-shifter, the through transmission path may be serpentine. The capacitance between the conductors of the through transmission line may be changed by methods other than electrical bias, as for example by means of temperature control. Electrical bias may be selected to be forward or reverse bias, as illustrated in FIGS. 3 and 4, or it may be only forward or only reverse bias, or the phase shifter may be operated with a bias voltage of zero volts. Heat sinking arrangements may be thermally coupled to the monolithic chip for carrying away heat dissipated during high power operation. Tuning elements may be associated with the chip phase shifter for optimizing operation over a particular frequency band. The bottom of the monolithic chip may be coupled to a mounting plate by methods other than use of conductive epoxy, as by soldering, brazing or the like. While the structure as described is capable of continuous control over a range, it may be desirable for some applications to apply control signals in such a manner as to achieve step variation in phase. Two or more phase shifters may be cascaded to achieve a greater range of phase shift. Blocking capacitors may be placed in series with the the through transmission line if required. The high impedance element by which the bias is isolated from the through transmission line may include a resistance.

What is claimed is:

1. A phase shifter comprising:

a monolithic chip including a pair of mutually parallel substantially flat sides, said chip comprising doping layers oriented parallel with and in between said substantially flat sides and defining a PIN junction including a P doping layer and an N doping layer separated by a substantially intrinsic layer, said PIN junction being elongated along a line parallel with said substantially flat sides to define first and second ends of said PIN junction;

applying means coupled to said P doping layer and to said N doping layer of said PIN junction at said first end and adapted to be coupled to a source of alternating current signal, said source of alternating current signal including a first and second terminals, for applying said first terminal to said P doping layer and applying said second terminal to said N doping layer at said first end of said PIN junction whereby said alternating current signal propagates from said first end towards said second end through said PIN junction;

alternating current coupling means coupled to said P doping layer and to said N doping layer of said PIN junction at said second end and adapted to be coupled to an alternating current utilization means, said alternating current utilization means including first and second terminals, for coupling said first terminal of said alternating current utilization means to said P doping layer and said second terminal of said alternating current utilization means to said N doping layer, thereby coupling alternating current signal from said second end; and bias means coupled to said P doping layer and to said N doping layer of said PIN junction for applying a direct bias to said PIN junction for biasing said junction into one of first and second states, said first state being forward bias in which said P doping layer is at a positive voltage with respect to said N doping layer, and said second state being reverse bias in which said P doping layer is at a negative voltage with respect to said N doping layer for controlling the phase of said signal coupled from said second end of said PIN junction in a continuous manner in response to the magnitude of said bias.

2. A PIN diode distributed phase shifter, comprising:

a substantially flat monolithic chip including a first layer comprising one of n+ and p+ doped semiconductor overlaid by a substantially intrinsic semiconductor layer, and also including a first elongated strip comprising the other one of said n+ and p+ doped semiconductor overlying said intrinsic semiconductor layer, said elongated strip having first and second ends and a traverse dimension orthogonal to the direction of elongation of said elongated strip, the layers forming an elongated PIN junction;

a first metallization layer bonded over substantially the entire first layer on a side remote from said intrinsic semiconductor layer;

a second metallization layer bonded over substantially the entire elongated strip on a side remote from said intrinsic semiconductor layer, thereby forming in conjunction with said first metallization layer and said intrinsic semiconductor layer a transmission line having a shunt capacitance associated with said PIN junction;

coupling means for coupling an alternating signal to said first end of said strip for forming a signal propagating principally in said PIN junction toward said second end of said strip, and means for coupling a phase shifted alternating signal from said second end of said strip to utilization means; and control means coupled to said first and second metallization layers for applying a direct bias to said second metallization layer relative to said first metallization layer for selectively establishing one of first and second bias conditions for said PIN junction, said first bias condition being forward-bias and said second bias condition being reverse-bias whereby the phase of said phase shifted alternating signal is thereby shifted relative to an unbiased condition of said PIN junction in a substantially continuous manner in response to the magnitude of said direct bias.

3. A phase shifter according to claim 2, wherein said control means comprises a high impedance means coupled to said second metallization layer at a point between said first and second ends for simultaneously coupling said bias to said second metallization layer and preventing substantial leakage of said alternating signal away from said transmission line.

4. A phase shifter according to claim 3 wherein said high impedance means comprises a choke.

5. A phase shifter according to claim 2 wherein said control means comprises a controllable source of direct current coupled to said first and second metallization layers for forward biasing said junction with a forward current.

6. A phase shifter according to claim 2 wherein said control means comprises a controllable source of direct voltage coupled to said first and second metallization layers for reverse-biasing said junction.

7. A PIN diode distributed phase shifter, comprising:

a substantially flat monolithic chip including a first semiconductor layer comprising one of n+ and p+ doped semiconductor overlaid by a substantially intrinsic semiconductor layer, and also including a first elongated strip comprising the other one of said n+ and p+ doped semiconductor overlying said intrinsic semiconductor layer, said elongated strip having first and second ends and a transverse dimension orthogonal to the direction of elongation of said elongated strip, the layers forming an elongated PIN junction;

a first metallization layer bonded over substantially the entirety of said first semiconductor layer on a side remote from said intrinsic semiconductor layer;

a second metallization layer bonded over substantially the entirety of said elongated strip on a side remote from said intrinsic semiconductor layer, thereby forming in conjunction with said first metallization layer and said intrinsic semiconductor layer a transmission line having shunt capacitance associated with said PIN junction;

coupling means for coupling an alternating signal to said first end of said strip for forming a signal propagating principally in said PIN junction towards said second end of said strip, and means for coupling a phase shifted alternating signal from said second end of said strip to utilization means; and control means coupled to said first and second metallization layers and comprising a solenoidally wound choke, having high impedance, coupled to said second metallization layer for applying a direct bias to said second metallization layer relative to said first metallization layer for selectively establishing one of first and second bias conditions for said PIN junction, said first bias condition being forward-bias and said second bias condition being reverse-bias, whereby the phase of said phase shifted alternating signal is thereby shifted relative to an unbiased condition of said PIN junction in a substantially continuous manner in response to the magnitude of said direct bias.

8. A phase shifter according to claim 7 wherein said choke comprises a magnetic core.

9. A PIN diode distributed phase shifter, comprising:

a substantially flat monolithic chip including an n+ semiconductive layer overlaid by a substantially intrinsic semiconductor layer, and also including a p+ semiconductive layer in the form of an elongated strip overlying said intrinsic semiconductive layer, said elongated strip having first and second ends, the layers forming an elongated PIN junction;

a first metallization layer bonded over substantially the entire side of said n+ semiconductive layer remote from said intrinsic semiconductive layer;

a second metallization layer bonded over substantially the entire side of said strip remote from said intrinsic semiconductive layer thereby forming in conjunction with said first metallization layer a transmission line having a series inductance associated principally with said second metallization layer and a shunt capacitance associated with said PIN junction;

coupling means for coupling an alternating signal to said first end of said strip for forming a signal propagating principally in said PIN junction toward said second end of said strip, and means for coupling a phase shifted alternating signal from said second end of said strip to utilization means; and control means coupled across said first and second metallization layers for applying a direct bias to said second metallization layer relative to said first metallization layer for selectively establishing one of first and second bias conditions for said PIN junction, said first bias condition being forward-bias and said second bias condition being reverse-bias for controlling the phase of said phase shifted alternating signal in response to the magnitude of said direct bias.

10. A phase-shifter according to claim 9, wherein said control means comprises high impedance means coupled to said second metallization layer at a point between said first and second ends for simultaneously coupling said bias to said second metallization layer and preventing substantial leakage of said alternating signal away from said transmission line.

11. A phase shifter according to claim 10 wherein said high impedance means comprises a choke.

12. A phase shifter according to claim 11 wherein said choke comprises a solenoid winding.

13. A PIN diode distributed phase shifter, comprising:

a substantially flat monolithic chip including an n+ semiconductive layer overlaid by a substantially intrinsic semiconductive layer, and also including a p+ semiconductive layer in the form of an elongated first strip overlying said intrinsic semiconductive layer and having a transverse dimension orthogonal to the direction of elongation, said elongated first strip having first and second ends, the layers forming an elongated PIN junction;

a first metallization layer bonded over substantially the entire side of said n+ semiconductive layer remote from said intrinsic semiconductive layer;

a second metallization layer bonded over substantially the entire side of said first strip remote from said intrinsic semiconductive layer thereby forming in conjunction with said first metallization layer a transmission line having a shunt capacitance associated principally with said PIN junction;

coupling means for cupling an alternating signal to said first end of said strip for forming a signal propagating principally in said PIN junction toward said second end of said first strip, and means for coupling a phase shifted alternating signal from said second end of said first strip to utilization means; and control means coupled to said first and second metallization layers and comprising a second elongated strip having a transverse dimension orthogonal to the direction of elongation which is narrower than said first strip transverse dimension, of p+ layer overlying said intrinsic layer and intersecting said first elongated strip of p+ layer, and a third metallization layer overlying said second strip and intersecting said second metallization layer, for applying a direct bias to said second metallization layer relative to said first metallization layer for selectively establishing one of first and second bias conditions for said PIN junction, said first bias condition being forward-bias and said second bias condition being reverse-bias for controlling the phase of said phase shifted altering signal in response to the magnitude of said direct bias.

14. A phase shifter according to claim 13 wherein the length of said second elongated strip is approximately one quarter wavelength at the design center.

15. A phase shifter according to claim 14 further comprising low impedance means coupled to the end of said elongated second strip remote from the intersection of said elongated second strip with said first elongated strip.

16. A PIN diode distributed phase shifter, comprising:

a substantially flat monolithic chip including a first layer comprising one of n+ and p+ doped semiconductor overlaid by a substantially intrinsic semiconductor layer, and also including a first elongated strip comprising the other one of said n+ and p+ doped semiconductor overlying said intrinsic semiconductor layer, said elongated strip having first and second ends and a transverse dimension orthogonal to the direction of elongation of said elongated strip, the layers forming an elongated PIN junction;

a first metallization layer bonded over substantially the entire side of said first layer remote from said intrinsic semiconductor layer;

a second metallization layer bonded over substantially the entire elongated strip on a side remote from said intrinsic semiconductor layer, thereby forming in conjunction with said first metallization layer and said intrinsicl semiconductor layer a transmission line having a shunt capacitance associated with said PIN junction;

coupling means for coupling an alternating signal to said first end of said strip for forming a signal propagating principally in said PIN junction toward said second end of said strip, and means for coupling a phase shifted alternating signal from said second end of said strip to utilization means; and control means coupled to said first and second metallization layers and comprising a second elongated strip including first and second ends, comprising said other one of said n+ and p+ doped semiconductor overlying said intrinsic layer, said second elongated strip having a transverse dimension orthogonal to the direction of elongation of said second elongated strip which is narrower than said transverse dimension of said first elongated strip, said first end of said second elongated strip intersecting said first elongated strip at a first intersection and merging with said first elongated strip at said first intersection, and a third metallization layer overlying said second elongated strip and intersecting said second metallization layer at a second intersection overlying said first intersection, said third metallization layer merging with said second metallization layer at said second intersection to form a high impedance choke for applying a direct bias from said second end of said second elongated strip to said second metallization layer relative to said first metallization layer for selectively establishing one of first and second bias conditions for said PIN junction, said first bias condition being forward-bias and said second bias condition being reverse-bias whereby the phase of said phase shifted signal is thereby shifted relative to an unbiased condition of said PIN junction in a substantially continuous manner in response to the magnitude of said direct bias.

17. A phase shifter according to claim 16 wherein the length of said second elongated strip is approximately one quarter wavelength at the design center frequency.

18. A phase shifter according to claim 17 further comprising low impedance means coupled to the end of said second elongated strip remote from the first intersection of said second elongated strip with said first elongated strip.

* * * * *